(12) United States Patent
Ichiryu et al.

(10) Patent No.: US 10,083,889 B2
(45) Date of Patent: Sep. 25, 2018

(54) ELECTRONIC COMPONENT PACKAGE INCLUDING SEALING RESIN LAYER, METAL MEMBER, CERAMIC SUBSTRATE, AND ELECTRONIC COMPONENT AND METHOD FOR MANUFACTURING THE SAME

(71) Applicant: Panasonic Corporation, Osaka (JP)

(72) Inventors: Takashi Ichiryu, Osaka (JP); Koji Kawakita, Nara (JP); Masanori Nomura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/597,115

(22) Filed: May 16, 2017

(65) Prior Publication Data
US 2017/0352603 A1    Dec. 7, 2017

(30) Foreign Application Priority Data
Jun. 2, 2016  (JP) .................................. 2016-111209

(51) Int. Cl.
*H01L 23/00*  (2006.01)
*H01L 23/29*  (2006.01)
(Continued)

(52) U.S. Cl.
CPC ...... *H01L 23/3121* (2013.01); *H01L 21/4817* (2013.01); *H01L 21/4853* (2013.01);
(Continued)

(58) Field of Classification Search
CPC ............. H01L 23/49503; H01L 23/495; H01L 23/49845; H01L 23/498; H01L 23/49894;
(Continued)

(56) References Cited

U.S. PATENT DOCUMENTS

| 6,770,959 B2 * | 8/2004 | Huang ................ H01L 21/4832 257/666 |
| 7,872,345 B2 * | 1/2011 | Chow ................... H01L 21/568 257/670 |

(Continued)

FOREIGN PATENT DOCUMENTS

| JP | 2-073653 | 3/1990 |
| JP | 2000-260915 | 9/2000 |

(Continued)

*Primary Examiner* — Jasmine Clark
(74) *Attorney, Agent, or Firm* — McDermott Will & Emery LLP

(57) ABSTRACT

An electronic component package includes: a sealing resin layer; a metal member buried therein and including a die bond portion and a terminal electrode portion located outside the die bond portion; a ceramic substrate buried in the sealing resin layer; and an electronic component disposed on the die bond portion. When viewed in plan, the die bond portion and the ceramic substrate are partially overlapped to be in contact with each other, and the terminal electrode portion and the ceramic substrate are partially overlapped to be in contact with each other. The electronic component is electrically connected to the terminal electrode portion. The metal member includes a first plating layer and a second plating layer, and the average crystal grain diameter of the first plating layer is smaller than the average crystal grain diameter of the second plating layer.

17 Claims, 10 Drawing Sheets

(51) Int. Cl.
*H01L 23/31* (2006.01)
*H01L 23/495* (2006.01)
*H01L 21/48* (2006.01)
*H01L 21/52* (2006.01)
*H01L 23/498* (2006.01)

(52) U.S. Cl.
CPC ............ *H01L 21/52* (2013.01); *H01L 23/293* (2013.01); *H01L 23/4952* (2013.01); *H01L 23/49548* (2013.01); *H01L 23/49894* (2013.01); *H01L 24/46* (2013.01); *H01L 2224/48091* (2013.01)

(58) Field of Classification Search
CPC . H01L 21/4853; H01L 21/56; H01L 21/4807; H01L 23/48503; H01L 23/49541; H01L 23/3121; H01L 23/49548; H01L 23/4952; H01L 2224/48091; H01L 21/565; H01L 21/52; H01L 23/293; H01L 23/562
See application file for complete search history.

(56) References Cited

U.S. PATENT DOCUMENTS

| | | | |
|---|---|---|---|
| 8,519,521 B2 * | 8/2013 | Krishnan | H01L 23/49541 257/666 |
| 2015/0214129 A1 | 7/2015 | Kawakita et al. | |

FOREIGN PATENT DOCUMENTS

| | | |
|---|---|---|
| JP | 2004-119765 | 4/2004 |
| JP | 2006-156447 | 6/2006 |
| JP | 2007-036172 | 2/2007 |
| JP | 2010-272898 | 12/2010 |
| JP | 2010-283265 | 12/2010 |
| JP | 2014-045169 | 3/2014 |
| WO | 2014/097641 | 6/2014 |

* cited by examiner

ELECTRONIC COMPONENT PACKAGE INCLUDING SEALING RESIN LAYER, METAL MEMBER, CERAMIC SUBSTRATE, AND ELECTRONIC COMPONENT AND METHOD FOR MANUFACTURING THE SAME

BACKGROUND

1. Technical Field

The present disclosure relates to an electronic component package and a method for manufacturing the same.

2. Description of the Related Art

In recent years, attention has been paid on development of a power device and a power module, each of which is used for motor control or electric power conversion expected to have an energy saving effect. The reasons for this are that, for example, an increase in capacity and a reduction in size of an insulated gate bipolar transistor (IGBT) which is a major element have been advanced, and since development of semiconductors has been advanced, the application thereof to power devices is about to be actually realized.

As a package structure used for a power device, for example, a "case structure in which sealing is performed by a gel material" and a "lead frame structure in which sealing is performed by a mold resin" may be mentioned. Those structures are selectively used depending on their respective applications. In an industrial application which requires a large current and a high voltage, the "case structure in which sealing is performed by a gel material" is used, and on the other hand, in a home appliance application which requires a relatively small current, the "lead frame structure in which sealing is performed by a mold resin" is used, so that those two types of structures are selectively used in accordance with their applications.

In both of the above structures, inside the package, a semiconductor element bonded to a base plate or a die pad of a lead frame is electrically connected to a lead portion extending to the outside by wire boding.

Japanese Unexamined Patent Application Publication Nos. 2-73653, 2000-260915, 2004-119765, and 2010-283265 have disclosed those related arts.

SUMMARY

In one general aspect, the techniques disclosed here feature an electronic component package comprising: a sealing resin layer; a metal member buried in the sealing resin layer and including a die bond portion and a terminal electrode portion located outside the die bond portion; a ceramic substrate buried in the sealing resin layer; and an electronic component disposed on the die bond portion. When viewed in plan, the die bond portion and the ceramic substrate are partially overlapped and in contact with each other, and the terminal electrode portion and the ceramic substrate are partially overlapped and in contact with each other. The electronic component and the terminal electrode portion are electrically connected to each other. The metal member includes a first plating layer and a second plating layer, and the average crystal grain diameter of the first plating layer is smaller than the average crystal grain diameter of the second plating layer.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
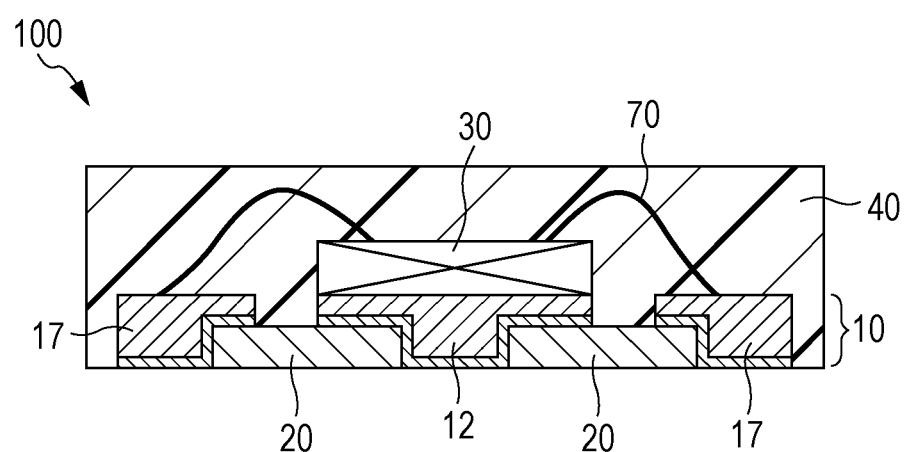
FIG. 1 is a cross-sectional view schematically showing the structure of an electronic component package according to a first embodiment of the present disclosure.

DETAILED DESCRIPTION (Underlying Knowledge Forming Basis of the Present Disclosure)

The present inventors have found the following problems of package techniques, and as a result, an electronic component package according to the present disclosure and a method for manufacturing the same were finally invented.

The package using a mold resin for a power device described in the "Related Art" is generally used for home appliance application which requires a relatively small current. Hence, in order to obtain a small package for application which requires approximately several hundreds to a thousand of voltage as a handling voltage, a package structure which can secure insulating properties is necessary, and hence, the reduction in size of an electronic component package is limited to a certain extent.

On the other hand, a semiconductor element to be used for motor drive is used as a switch for switching ON and OFF. An electric loss generated when the current is converted generates heat, and when heat dissipation of a package is not sufficiently performed, the package is exposed to a high temperature atmosphere. As a result, malfunction or damage of a semiconductor element may occur, and the reliability may be adversely influenced by a heat stress and/or strain in some cases. That is, the structure capable of efficiently dissipating heat from a device is required, and in order to reduce the size of the package, the heat dissipation property is significantly important.

As described above, the present inventors have found that since the heat density is increased when the size of the electronic component package is reduced, a structure having a more excellent heat dissipation property is required.

Hence, the present inventors carried out intensive research in order to provide an electronic component package technique which realizes a more excellent heat dissipation property. In more particular, intensive research was carried out in order to provide an electronic component package technique which realizes a more excellent heat dissipation property besides a high reliability.

The present inventors finally invented a novel electronic component package and a manufacturing method thereof by the research carried out based on a unique concept but not along the trend of the related arts.

An electronic component package according to an aspect of the present disclosure comprises: a sealing resin layer; a metal member buried in the sealing resin layer and including a die bond portion and a terminal electrode portion located outside the die bond portion; a ceramic substrate buried in the sealing resin layer; and an electronic component disposed on the die bond portion. When viewed in plan, the die bond portion and the ceramic substrate are partially overlapped and in contact with each other, and the terminal electrode portion and the ceramic substrate are partially overlapped and in contact with each other. The electronic component and the terminal electrode portion are electrically connected to each other. The metal member includes a first plating layer and a second plating layer, and the average crystal grain diameter of the first plating layer is smaller than the average crystal grain diameter of the second plating layer.

In addition, a method for manufacturing an electronic component package according to another aspect of the present disclosure comprises: forming a die bond portion and a terminal electrode portion by performing a patterning treatment on a metal member bonded to a ceramic substrate on a carrier; disposing an electronic component on the die bond portion; forming a package precursor including the carrier, the ceramic substrate, the metal member, and the electronic component by forming a sealing resin layer on the carrier so as to cover the electronic component; and peeling the carrier away from the package precursor.

According to the present disclosure, in an electronic component package to be driven by a large current and a high voltage, a more preferable heat dissipation property can be obtained. In a certain aspect, although the distance between the electronic component and the terminal electrode in the electronic component package is further decreased, since the creepage distance between external terminals of the package is secured by the ceramic substrate, the reduction in size of the entire electronic component package can be achieved. In a certain aspect, although the size of the entire package is reduced, the inductance component caused by the diameters and lengths of wires can be reduced.

Hereinafter, the electronic component package and the manufacturing method according to the aspects of the present disclosure will be described in detail with reference to the drawings. Various types of elements shown in the drawings are only schematically drawn for easy understanding of the present disclosure, and hence, it is to be noted that the dimensional ratio, the appearance, and the like may be different from those of the actual elements in some cases.

An "up and down direction" and a "left and right direction" used directly or indirectly in the present disclosure correspond to the up and down direction and the left and the right direction, respectively, in each drawing. Unless otherwise particularly noted, the same reference numeral or mark indicates the same member or the same meaning.

(Electronic Component Package According to Aspect of Present Disclosure)

FIG. 1 schematically shows the structure of an electronic component package 100 according to an aspect of the present disclosure. As shown in the figure, the electronic component package 100 according to the aspect of the present disclosure includes a metal member 10, ceramic substrates 20, an electronic component 30, and a sealing resin layer 40.

In the electronic component package 100, the metal member 10, the ceramic substrates 20, and the electronic component 30 are buried in the sealing resin layer 40. In the sealing resin layer 40, the metal member 10 is bonded to the ceramic substrates 20. In particular, the metal member 10 is bonded to each ceramic substrate 20 so as to be partially overlapped with each other. As shown in the figure, the metal member 10 is not entirely bonded to the ceramic substrate 20, and the ceramic substrate 20 is not entirely bonded to the metal member 10, so that a part of the metal member 10 is only bonded to only a part of the ceramic substrate 20 in a lamination structure. As apparent from the aspect shown in the figure, in the present disclosure, the "being bonded so as to be partially overlapped with each other" does not indicate the aspect in which the members to be overlapped with each other in their width directions are all bonded to each other but indicates the aspect in which the members are only partially bonded to each other in their width directions.

In the electronic component package 100, a die bond portion 12 and terminal electrode portions 17 are provided and are formed from the metal member 10. That is, as shown in the figure, the die bond portion 12 and the terminal electrode portions 17 located outside the die bond portion 12 are formed from the metal member 10. The electronic component 30 is disposed on the die bond portion 12 and is electrically connected to the terminal electrode portions 17. As shown in the figure, the electronic component 30 may be electrically connected to the terminal electrode portions 17 with metal lines 70, such as wires. In addition, the number of the terminal electrode portions 17 is not limited to one, and as shown in the figure, at least two terminal electrode portions 17 may be provided.

In the present disclosure, the "die bond portion" indicates a so-called "die", that is, indicates a portion to which an electronic component, such as a semiconductor element, is fixed. According to the present disclosure, an object to be fixed is not limited to a semiconductor element, and any types of electronic components other than that may also be used. In addition, in the present disclosure, the "terminal electrode portion" indicates an electrode forming an external terminal of the package in a wide meaning, and in a narrow meaning, indicates an electrode forming an external terminal which is to be electrically connected to the electronic component on the die bond portion with a metal line.

In the electronic component package 100, an outer edge of a bottom surface of the die bond portion 12 and an outer edge of a top surface of the ceramic substrate 20 may be bonded to each other. As shown in the figure, a part of the outer edge of the metal member 10 which forms the die bond portion 12 and a part of the outer edge of the ceramic substrate 20 may be bonded to each other so that the die bond portion 12 is located relatively at an upper side, and the ceramic substrate 20 is located relatively at a lower side. The bond structure as described above is to contribute to a higher heat dissipation property and the reduction in inductance as described below.

In addition, in the present disclosure, the "outer edge" indicates when viewed in cross-section, a region of an object member (in the above example, which includes the die bond portion 12 and the ceramic substrate 20) located at least at an outer side than the central portion thereof. For example, the "outer edge" indicates when viewed in cross-section, a region from the outermost edge of the object member to an inside at a distance corresponding to 40% or less of the width dimension of the object member. The "outer edge" may indicate when viewed in cross-section, a region from the outermost edge of the object member to an inside at a distance corresponding to 30% or less of the width dimension of the object member and may also indicate a region from the outermost edge of the object member to an inside at a distance corresponding to 20% or less of the width dimension thereof.

In the electronic component package according to the present disclosure, a higher heat dissipation property can be obtained. Compared to a related package in which a bottom surface of a package is formed of a metal member forming an electrode terminal and a sealing resin material having a low thermal conductivity, in the package of the present disclosure in which the metal member and the ceramic substrates, each of which has a high thermal conductivity, are exposed to the bottom surface of the package, since heat generated in the package is efficiently transmitted to the bottom surface thereof, a higher heat dissipation property can be obtained in the entire bottom surface of the package. In addition, in the electronic component package according to the present disclosure, since the creepage distance between the external terminals of the package, which is generally vulnerable at a high voltage application, is secured by the ceramic, the distance between the internal terminals covered with the sealing resin layer can be decreased. Hence, the inductance caused by the reduction in size of the package or by the wire lengths can be reduced.

Figure 2A:
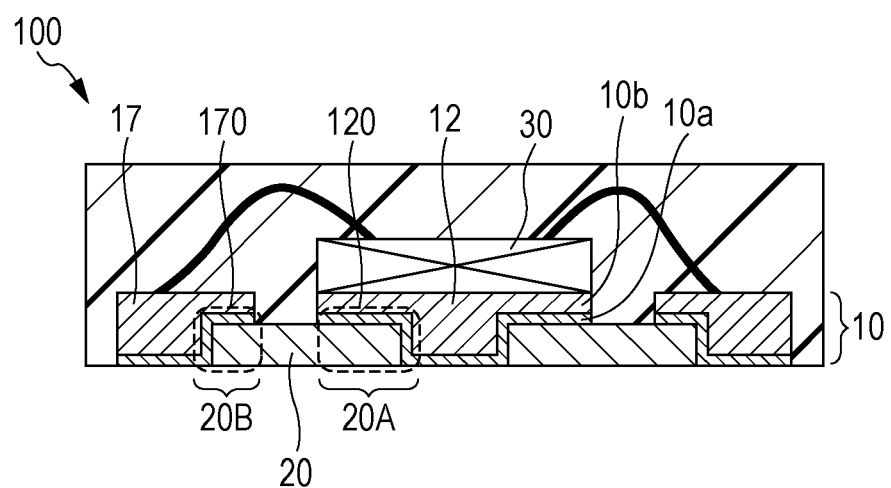
FIG. 2A is a cross-sectional view schematically showing the structure of an electronic component package according to an aspect of the present disclosure.

According to a certain aspect of the electronic component package, recess portions 120 may be provided in the outer edge of the die bond portion 12, and with respect to those recess portions 120 of the die bond portion 12, a part 20A of each ceramic substrate 20 may be disposed (see FIG. 2A). The recess portion 120 is a part of the die bond portion 12 at which the thickness is relatively decreased. The recess portion 120 corresponds to a first recess portion of the present disclosure. The part 20A of the ceramic substrate 20 corresponds to a first portion of the ceramic substrate of the present disclosure. For example, as shown in FIG. 2A, the part 20A of the ceramic substrate 20 may be formed so as to be engaged in the recess portion 120 of the die bond portion 12. Accordingly, the creepage distance between the external terminals of the package can be secured by the ceramic, and hence, the distance between the internal electrodes covered with the sealing resin layer can be further decreased. That is, the size of the electronic component package can be reduced.

In general, right under an electronic component which generates heat, when no metal member having an excellent thermal conductivity extends to a substrate mounting surface, degradation in heat dissipation property may occur. However, in the present disclosure, since the "ceramic substrate having a high heat dissipation property as compared to that of the sealing resin layer" is disposed in the recess portion formed in the substrate mounting surface of the die bond portion, while the heat dissipation property is secured, the distance between the terminal electrodes which are exposed is secured, and the decrease in length of wires inside the package can be achieved, so that the size of the package can be reduced. As for the die bond portion 12 in which the recess portion is provided, at least one side of the substrate mounting surface of the die bond portion 12 may be shorter than at least one side of the electronic component 30 mounted thereon.

The electronic component package of the present disclosure can be realized in various concrete aspects. Hereinafter, more particular items and aspects of the electronic component package will be described.

According to a certain aspect of the electronic component package, an outer edge of a bottom surface of the terminal electrode portion 17 and an outer edge of a top surface of the ceramic substrate are bonded to each other. As shown in FIGS. 1 and 2A, a part of the outer edge of the metal member 10 forming the terminal electrode portion 17 and a part of the outer edge of the ceramic substrate 20 may be bonded to each other so that the terminal electrode portion 17 is disposed relatively at an upper side, and the ceramic substrate 20 is disposed relatively at a lower side. By the bond structure as described above, a higher heat dissipation property and the reduction in inductance can both be obtained.

For example, in the outer edge of the terminal electrode portion 17, a recess portion 170 having a depth relatively smaller than the thickness of the terminal electrode portion 17 may be provided, and with respect to this recess portion 170 of the terminal electrode portion 17, a part 20B of the ceramic substrate 20 may be disposed (see FIG. 2A). The recess portion 170 is a portion of the terminal electrode portion 17 having a relatively small thickness. The recess portion 170 corresponds to a second recess portion of the present disclosure. The part 20B of the ceramic substrate 20 corresponds to a second portion of the ceramic substrate according to the present disclosure. As shown in FIG. 2A, the part 20B of the ceramic substrate 20 may be formed so as to be engaged in the recess portion 170 of the terminal electrode portion 17. Accordingly, the creepage distance between the external terminals of the package is secured by the ceramic, and the distance between the internal electrodes covered with the sealing resin layer can be further decreased. That is, the size of the electronic component package can be reduced.

As apparent from the aspect shown in the figures, in a certain aspect, the ceramic substrate 20 may be disposed in the recess portion 170 of the terminal electrode portion 17 and may also be disposed in the recess portion 120 of the die bond portion 12. In other words, one of a pair of the outer edges of the ceramic substrate 20 facing each other may be bonded to the die bond portion 12 by engagement in the recess portion 120 thereof, and the other of the pair of the outer edges described above may be bonded to the terminal electrode portion 17 by engagement in the recess portion 170 thereof.

The ceramic substrate 20 used for the electronic component package 100 of the present disclosure may be a substrate containing, for example, at least one selected from the group consisting of alumina, zirconia, aluminum nitride and silicon nitride. When the ceramic substrate having a high thermal conductivity as described above (in more particular, the ceramic substrate having a high thermal conductivity as compared to that of the sealing resin material) is disposed, the heat dissipation property at the bottom surface of the package can be further increased, and the temperature of the package in operation can be decreased. Simply by way of example, the ceramic substrate 20 is substantially formed of aluminum nitride.

The thickness of the ceramic substrate 20 may be smaller than that of the metal member 10, and accordingly, the ceramic substrate 20 can be partially disposed with respect to the recess portion of at least one of the die bond portion 12 and the terminal electrode portion 17. That is, as shown in FIG. 2A, one of the pair of the outer edges facing each other of the ceramic substrate 20 having a smaller thickness than that of the metal member 10 may be bonded to the die bond portion 12 by engagement in the recess portion 120 thereof, and the other of the pair of the outer edges described above may be bonded to the terminal electrode portion 17 by engagement in the recess portion 170 thereof. Simply by way of example, the thickness of the ceramic substrate 20 may be 0.1 to 2.0 mm and may also be 0.2 to 1.0 mm.

The metal member 10 used for the electronic component package 100 of the present disclosure may be formed from any material which contributes to the heat dissipation property of the package. For example, a metal material of the metal member 10 may be at least one selected from the group consisting of copper (Cu), aluminum (Al), silver (Ag), palladium (Pd), platinum (Pt), and nickel (Ni).

The metal member 10 may be formed by plating and may have at least a dry plating layer and a wet plating layer. In more particular, the metal member 10 may be formed of a dry plating layer which is a first plating layer 10a at a side in contact with the ceramic substrate 20 and a wet plating layer which is a second plating layer 10b disposed on the first plating layer 10a (see FIG. 2A). By the structure described above, the metal member 10 and the ceramic substrate 20 are bonded by plating, and the adhesion therebetween can be further secured although the ceramic substrate 20 is generally believed to be inferior in compatibility with a metal material, so that the reliability can be improved. The first plating layer 10a of the die bond portion 12 and the ceramic substrate 20 may be in contact with each other, and the first plating layer 10a of the terminal electrode portion 17 and the ceramic substrate 20 may be in contact with each other.

In the electronic component package 100, the dry plating layer corresponds to a layer formed of grains having a relatively small average crystal grain diameter, and on the other hand, the wet plating layer corresponds to a layer formed of grains having a relatively large average crystal grain diameter. In other words, the metal member 10 may include the first plating layer 10a and the second plating layer 10b, and the average crystal grain diameter of the first plating layer 10a may be smaller than that of the second plating layer 10b. As apparent from the aspect shown in FIG. 2B, the "first plating layer 10a formed of grains having a relatively small average crystal grain diameter" is disposed at a side in contact with the ceramic substrate 20, and on the other hand, the "second plating layer 10b formed of grains having a relatively large average crystal grain diameter" is disposed at a side in contact with the electronic component 30. The metal member 10 having a two-layer structure formed of the layers having different average crystal grain diameters can contribute to the improvement in adhesion to the ceramic substrate.

Figure 2B:
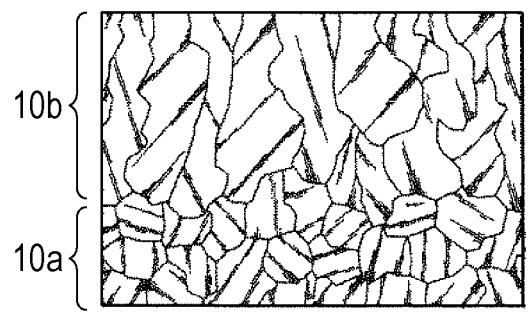
FIG. 2B is an enlarged cross-sectional view schematically showing a first plating layer and a second plating layer included in a metal member.

Simply by way of example, the average crystal grain diameter of the first plating layer 10a may be 2 μm or less, and the average crystal grain diameter of the second plating layer 10b may be 5 μm or more. In more particular, for example, the "average crystal grain diameter of the first plating layer 10a" is set to more than 0 to 2 μm, and on the other hand, the "average crystal grain diameter of the second plating layer 10b" is set to 5 to 20 μm. The "average crystal grain diameter" described in the present disclosure indicates a crystal grain diameter calculated based on a cross-sectional image as shown in FIG. 2B obtained by cutting the metal member along the thickness direction thereof. For example, the "crystal grain diameter" indicates the diameter of a circle having the same area as that of the crystal grain obtained from the cross-sectional image as described above, and the "average crystal grain diameter" indicates the value calculated as the number average (for example, the number average of 50 grains) of the crystal grain diameters as described above.

In this embodiment, the dry plating layer, that is, the first plating layer 10a, may contain at least one metal material selected from the group consisting of titanium (Ti), chromium (Cr), and nickel (Ni). On the other hand, the wet plating layer, that is, the second plating layer 10b, may contain at least one metal material selected from the group consisting of copper (Cu), nickel (Ni), and aluminum (Al). Because of the two-layer structure of the metal member 10 formed from those metal materials, a higher adhesion between the metal member 10 and the ceramic substrate 20 can be obtained. In addition, in the electronic component package 100, an exposed first plating layer 10a may be selectively removed in a subsequent step.

As the electronic component 30 used for the electronic component package 100, any type may be used as long as being a circuit component or a circuit element to be used in electronic mounting fields. Simply by way of example, as the types of electronic component described above, an integrated circuit (IC) (such as a control IC), an inductor, a capacitor, a power semiconductor element, a light emitting element (such as a light emitting diode (LED)), a chip resistor, a chip capacitor, a chip varistor, a chip thermistor, another chip multilayer filter, a connection terminal, and the like may be mentioned. In a certain aspect, the electronic component 30 used for the electronic component package 100 is a power semiconductor element. As the power semiconductor element described above, for example, there may be used an insulated gate bipolar transistor (IGBT) and a wide gap semiconductor element, each of which is used for a power device or a power module and is desired to have a switching function at a high voltage and a large current. Although the temperature increase of the entire package caused by heat generation of a power semiconductor element may be concerned, in the electronic component package having a more excellent heat dissipation property of the present disclosure, an effect of suppressing the temperature increase of the device can be preferably obtained. In addition, in consideration of the current situation in which the development of semiconductors has been advanced, and the application thereof to power devices is about to be actually realized, as the power semiconductor element used as the electronic component 30, a wide gap semiconductor element may be used. As the wide gap semiconductor, for example, GaN and SiC may be mentioned. Since the wide gap semiconductor element is used as the semiconductor element, an electronic component package having a low switching loss and a higher conversion efficiency can be obtained, and as a result, a more desirable power device can be obtained.

As the sealing resin layer 40 used for the electronic component package 100 of the present disclosure, a layer formed of any material having an insulating property may be used. For example, a material of the sealing resin layer 40 may be at least one selected from the group consisting of an acrylic resin, a urethane resin, a silicone resin, a fluorinated resin, a polyimide resin, and an epoxy resin. The thickness of the sealing resin layer 40 may be approximately 1.2 to 6.0 mm and may also be approximately 2.5 to 4.0 mm.

As a certain aspect of the electronic component package, the die bond portion and the terminal electrode portions are flush with each other at the bottom surface of the electronic component package. In particular, as shown in FIG. 1, the bottom surface of the die bond portion 12, the bottom surfaces of the terminal electrode portions 17, and the bottom surfaces of the ceramic substrates 20 are flush with each other. In more particular, the die bond portion 12, the terminal electrode portions 17, and the ceramic substrates 20 may also be flush with the sealing resin layer 40. In the case in which the metal member 10 forming the die bond portion 12 and the terminal electrode portions 17 includes the first plating layer 10a and the second plating layer 10b, the first plating layer 10a, the ceramic substrates 20, and the sealing resin layer 40 may be flush with each other. By the structure as described above, secondary mounting can be realized. In addition, since the die bond portion 12 and the terminal electrode portions 17, which are formed from the metal member 10, are not only exposed to the bottom surface of the electronic component package, but the ceramic substrates 20 bonded to the metal member 10 described above are also exposed to the same bottom surface as described above, a higher heat dissipation property can be obtained. In particular, compared to the related structure in which a sealing resin layer having a low thermal conductivity is exposed to the bottom surface, the variation in temperature of the entire package is reduced, and heat generated therein can be efficiently transmitted in a substrate direction. In addition, since the variation in temperature at the bottom surface is reduced, transient thermal characteristics and solder mountability in the secondary mounting are further improved, and solder melting can be more uniformly performed in the secondary mounting.

Figure 3:
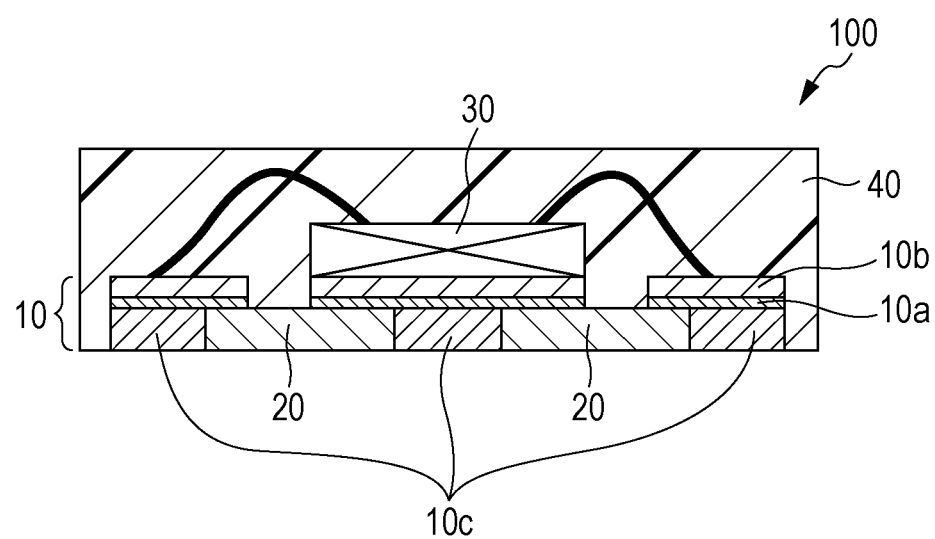
FIG. 3 is a cross-sectional view schematically showing the structure of an electronic component package according to a second embodiment of the present disclosure.

In a certain aspect of the electronic component package, the metal member 10 may further include non-plating metal portions 10c (see FIG. 3). In more particular, in the case in which the metal member 10 includes a portion formed by plating, a metal portion different from the portion formed by plating may also be included.

The "non-plating portion" of the present disclosure indicates a metal portion formed by a method different from plating. For example, the non-plating metal portion 10c may be a "lead frame processed by a patterning treatment" or a "separated metal to be engaged with the ceramic substrate 20". The formation of the metal member 10 by a plating treatment takes a relatively long time, and when the metal member 10 is partially formed of the non-plating metal portions, the formation time of the metal member 10 can be reduced.

A material of the non-plating metal portion 10c is not particularly limited as long as having a thermal conductivity. For example, the non-plating metal portion 10c may include at least one metal material selected from the group consisting of copper (Cu), aluminum (Al), silver (Ag), palladium (Pd), platinum (Pt), and nickel (Ni). In addition, the thickness of the non-plating metal portion 10c may be substantially the same as that of the ceramic substrate 20. In other words, the thickness of the non-plating metal portion 10c may be 0.1 to 2.0 mm and may also be 0.2 to 1.0 mm.

Method for Manufacturing Electronic Component Package According to Another Aspect of Present Disclosure)

Figure 4A:
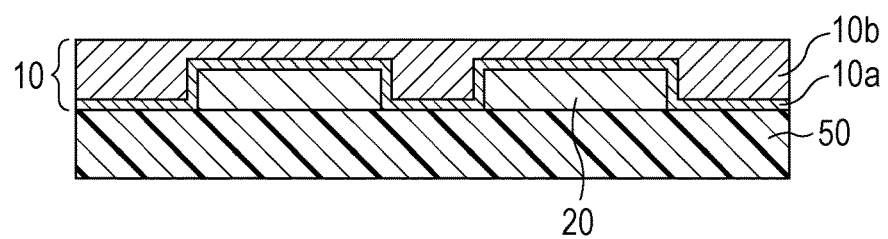
FIG. 4A is a cross-sectional view schematically showing a method for manufacturing an electronic component package according to another aspect of the present disclosure.
Figure 4B:
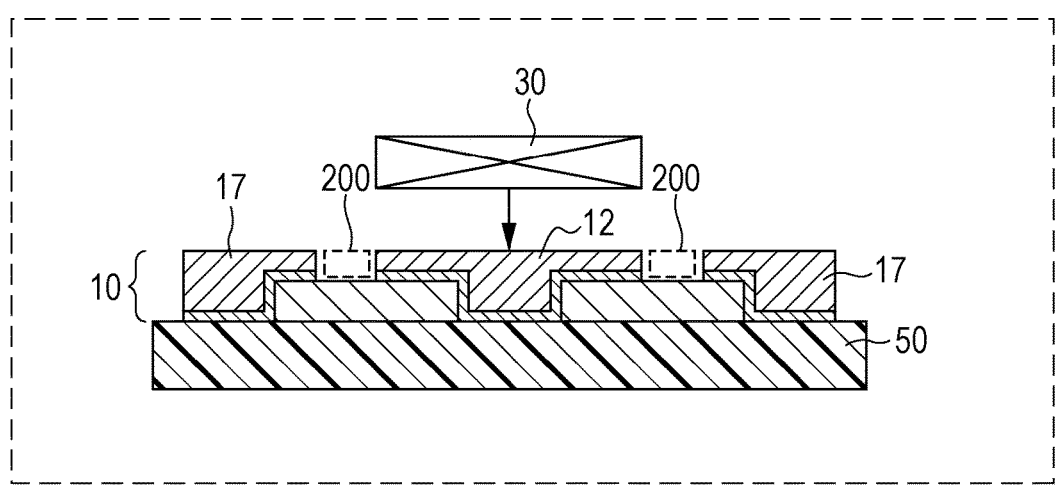
FIG. 4B is a cross-sectional view schematically showing the method for manufacturing an electronic component package according to the another aspect of the present disclosure.
Figure 4C:
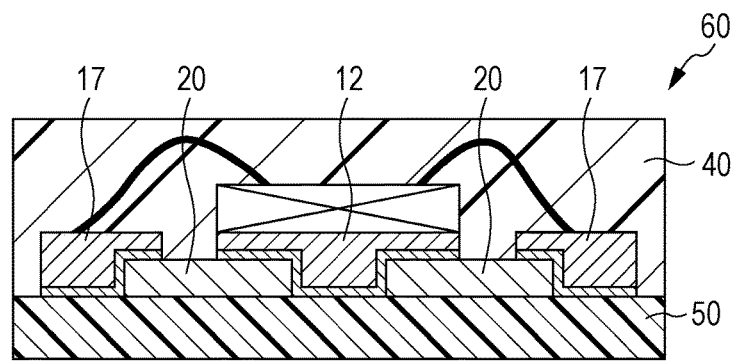
FIG. 4C is a cross-sectional view schematically showing the method for manufacturing an electronic component package according to the another aspect of the present disclosure.
Figure 4D:
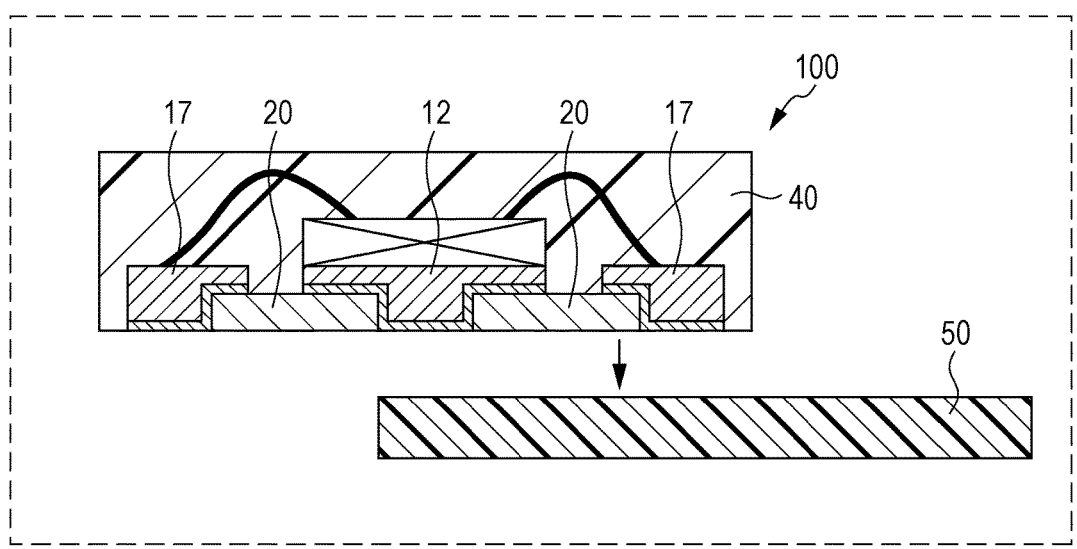
FIG. 4D is a cross-sectional view schematically showing the method for manufacturing an electronic component package according to the another aspect of the present disclosure.

In FIGS. 4A to 4D, the concept of a manufacturing method according to another aspect of the present disclosure is shown. First, as shown in FIG. 4A, a carrier 50 on which the ceramic substrates 20 and the metal member 10 are disposed is prepared. Next, as shown in FIG. 4B, after the die bond portion 12 and the terminal electrode portions 17 are formed by a patterning treatment performed on the metal member 10, the electronic component 30 is disposed on the die bond portion 12. Subsequently, as shown in FIG. 4C, the sealing resin layer 40 is formed on the carrier 50 to cover the electronic component 30, so that a package precursor 60 including the carrier 50, the ceramic substrates 20, the metal member 10, and the electronic component 30 is formed. Finally, as shown in FIG. 4D, the carrier 50 is peeled away from the package precursor 60.

In the manufacturing method according to the another aspect of the present disclosure, the die bond portion 12 and the terminal electrode portions 17 are formed by a patterning treatment performed on the metal member 10 bonded to the ceramic substrates 20, and as a result, the electronic component package 100 in which the metal member 10 and each of the ceramic substrates 20 are bonded so as to be partially overlapped with each other is obtained. In more particular, the structure in which the outer edges of the bottom surface of the die bond portion 12 formed from the metal member 10 are bonded to the outer edges of the top surfaces of the ceramic substrates 20 is obtained, and in addition the structure in which the outer edge of the bottom surface of the terminal electrode portion 17 formed from the metal member 10 is bonded to the outer edge of the top surface of the corresponding ceramic substrate 20 is also obtained.

In the patterning treatment shown in FIG. 4B, at least one region 200 between the die bond portion 12 and the terminal electrode portions 17, which are formed from the metal member 10, is at least removed. That is, the metal member 10 other than the die bond portion 12 and the terminal electrode portions 17 is at least removed. The patterning treatment itself is not particularly limited as long as being used for electronic mounting fields. For example, a desired patterning treatment may be performed using a photolithography in which resist formation, exposure, development, etching, and the like are performed.

In a certain aspect, the metal member itself is formed by a plating treatment. In more particular, a plating treatment may be performed on the ceramic substrates provided on the carrier so as to form the metal member on the ceramic substrates. As a result, since the ceramic substrates and the metal member are bonded to each other by plating, in an electronic component package to be manufactured, heat of the metal member can be more efficiently transmitted to the ceramic substrates.

As the plating treatment, after dry plating is performed, wet plating may be performed. In more particular, after dry plating is performed to form a dry plating layer in contact with the ceramic substrates 20, wet plating may be performed on the dry plating layer to form a wet plating layer. This process indicates that by performing a wet plating method after a dry plating method is performed, the "first plating layer 10a formed of grains having a relatively small average crystal grain diameter" and the "second plating layer 10b formed of grains having a relatively large average crystal grain diameter" are formed.

The dry plating layer is generally formed to have a very small thickness, and on the other hand, the wet plating layer is formed to have a relatively large thickness. The dry plating film can be formed to have a very small thickness so that for example, the heat resistance and the electric resistance can be substantially ignored. In other words, since the dry plating layer is used as an underlying layer, the wet plating layer can be formed to have a large thickness. From the aspect as described above, in the manufacturing method of the present disclosure, an "underlayer formed of grains having a relatively small average crystal grain diameter" can be formed by a dry plating method, and subsequently, by a wet plating method, a "thick layer formed of grains having a relatively large average crystal grain diameter" can be formed.

The dry plating method includes a physical vapor deposition method (PVD method) and a chemical vapor deposition method (CVD method). In addition, the PVD method includes sputtering, vacuum deposition, ion plating, and the like. On the other hand, the wet plating method includes an electric plating method (such as electrolysis plating), a chemical plating method, a hot dipping method, and the like.

In the package precursor 60 formed by the manufacturing method of the present disclosure, the die bond portion 12, the terminal electrode portions 17, and the ceramic substrates 20 are disposed on the carrier 50. Hence, when the carrier 50 is finally removed by peeling, the bottom surfaces of the die bond portion 12, the terminal electrode portions 17, and the ceramic substrates 20 can be flush with each other. That is, at the bottom surface of the electronic component package 100, the die bond portion 12, the terminal electrode portions 17, and the ceramic substrates 20 are flush with each other.

The "carrier" of the present disclosure is used as a support body disposing the ceramic substrates and forming the metal member and the sealing resin layer and indicates a member to be finally removed by peeling. For example, the carrier may be a sheet member and may be a sheet member having, for example, an adhesive property and/or a flexible property.

In a certain aspect, before the electronic component is mounted on the die bond portion, a process for planarizing the surface of the metal member is performed. In particular, before the electronic component is mounted, the surface of the die bond portion may be planarized. As a result, when the electronic component is die-bonded, voids can be prevented from being generated under the electronic component, so that a long-term reliability can be improved.

First Embodiment

A manufacturing method according to a first embodiment of the present disclosure will be described with reference to FIGS. 5A to 5H.

The manufacturing method of this embodiment comprises:
(i) a step of disposing ceramic substrates on a carrier having an adhesive property;
(ii) a step of forming a metal member which covers the ceramic substrates by performing a plating treatment;
(iii) a step of forming a die bond portion and terminal electrode portions from the metal member by performing a patterning treatment thereon;
(iv) a step of disposing an electronic component on the die bond portion and electrically connecting the electronic component to the terminal electrode portions;
(v) a step of forming a package precursor by forming a sealing resin layer on the carrier so as to cover the electronic component, the metal member, and the ceramic substrates; and
(vi) a step of peeling the carrier away from the package precursor to expose the ceramic substrates, the die bond portion, and the terminal electrode portions from the surface of the sealing resin layer.

Figure 5A:
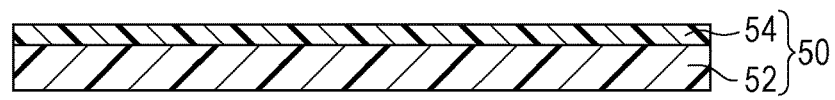
FIG. 5A is a step cross-sectional view schematically showing a method for manufacturing the electronic component package according to the first embodiment of the present disclosure.
Figure 5B:
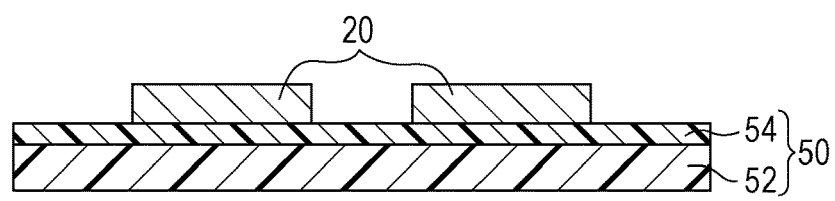
FIG. 5B is a step cross-sectional view schematically showing the method for manufacturing the electronic component package according to the first embodiment of the present disclosure.

The manufacturing method of the present disclosure according to the first embodiment will be described in detail. First, as the step (i), as shown in FIGS. 5A and 5B, the ceramic substrates 20 are disposed on the carrier 50 having an adhesive property. In more particular, the ceramic substrates 20 are provided so as to be adhered to the carrier 50.

The carrier 50 having an adhesive property may be, for example, a carrier sheet formed of a substrate and an adhesive layer. That is, as shown in FIG. 5A, a carrier sheet having a two-layer structure in which an adhesive layer 54 is provided on a support substrate 52 may be used. The support substrate 52 may have a flexible property.

As the support substrate 52, any sheet member may be used as long as the processes, such as the disposition of the ceramic substrates and the formation of the metal member and the sealing resin layer are not disturbed. For example, a material of the support substrate 52 may be a resin, a metal, a ceramic, or a combination thereof. As the resin for the support substrate 52, for example, there may be mentioned a polyester resin, such as a poly(ethylene terephthalate) (PET) or a poly(ethylene naphthalate), an acrylic resin, such as a poly(methyl methacrylate), a polycycloolefin resin, or a polycarbonate. As the metal for the support substrate 52, for example, there may be mentioned iron, copper, aluminum, or an alloy thereof. A material of the support substrate 52 may be, for example, a stainless steel material. As the ceramic for the support substrate 52, for example, there may be mentioned apatite, alumina, silica, silicon carbide, silicon nitride, or boron carbide. The thickness of the support substrate 52 itself may be, for example, 0.1 to 2.0 mm.

In addition, the adhesive layer 54 is not particularly limited as long as having an adhesive property to the ceramic substrate. For example, the adhesive layer 54 itself may contain at least one adhesive material selected from the group consisting of an acrylic resin adhesive, a urethane resin adhesive, a silicone resin adhesive, and an epoxy resin adhesive. The thickness of the adhesive layer 54 may be 2 to 50 µm and may also be 5 to 20 µm. The thickness of the adhesive layer 54 is for example, 10 µm. As the adhesive layer 54, for example, there may be used a tape formed of a resin thin layer, such as a PET film, having two main surfaces on each of which an adhesive layer is formed.

The number of the ceramic substrates 20 provided on the carrier 50 is not limited to one and may be, as shown in the figure, at least two. The ceramic substrate 20 may be a substrate containing at least one selected from the group consisting of alumina, zirconia, aluminum nitride, and silicon nitride. In addition, a substrate containing a composite material using as a primary component, the material mentioned above may be used as the ceramic substrate 20. In addition, in view of the thermal conductivity and the like, the thickness of the ceramic substrate 20 itself may be for example, 0.1 to 2.0 mm.

Figure 5C:
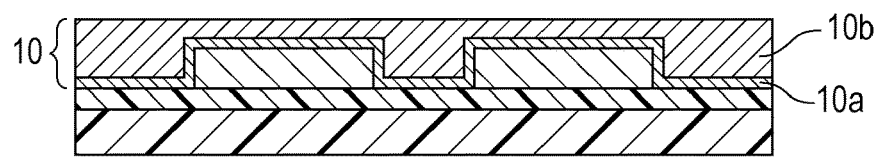
FIG. 5C is a step cross-sectional view schematically showing the method for manufacturing the electronic component package according to the first embodiment of the present disclosure.

The step (ii) is performed following the step (i). That is, as shown in FIG. 5C, the plating treatment is performed, so that the metal member 10 covering the ceramic substrates 20 is formed.

Figure 5D:
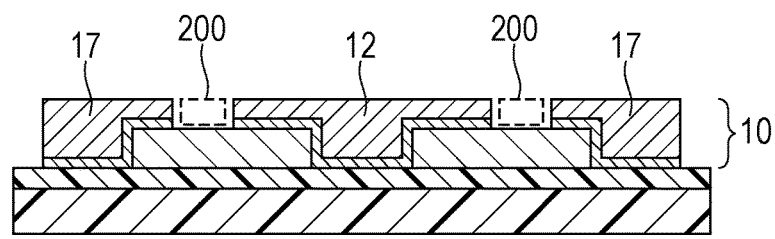
FIG. 5D is a step cross-sectional view schematically showing the method for manufacturing the electronic component package according to the first embodiment of the present disclosure.
Figure 5E:
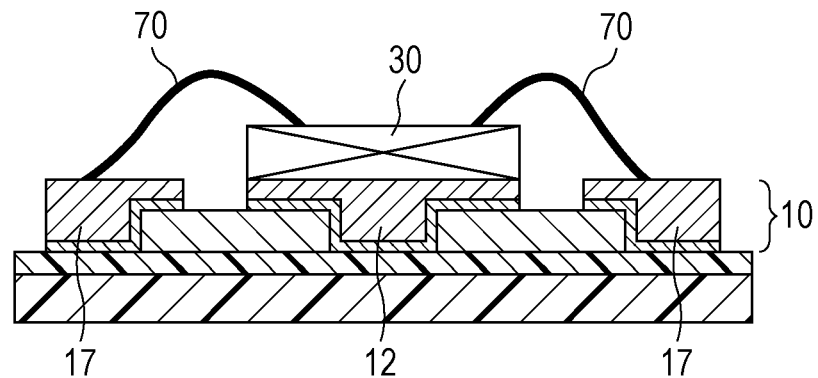
FIG. 5E is a step cross-sectional view schematically showing the method for manufacturing the electronic component package according to the first embodiment of the present disclosure.
Figure 5F:
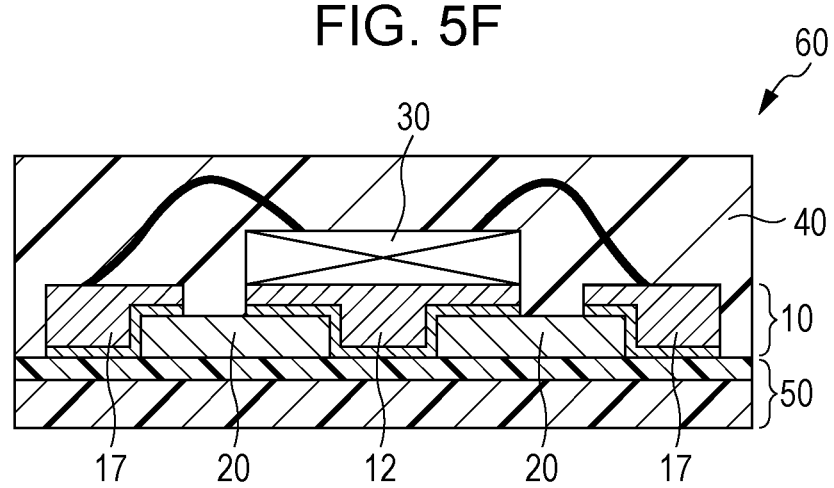
FIG. 5F is a step cross-sectional view schematically showing the method for manufacturing the electronic component package according to the first embodiment of the present disclosure.
Figure 5G:
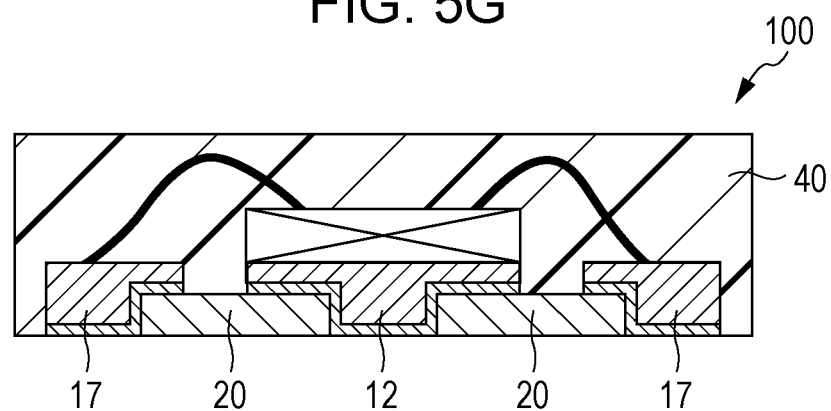
FIG. 5G is a step cross-sectional view schematically showing the method for manufacturing the electronic component package according to the first embodiment of the present disclosure.
Figure 5H:
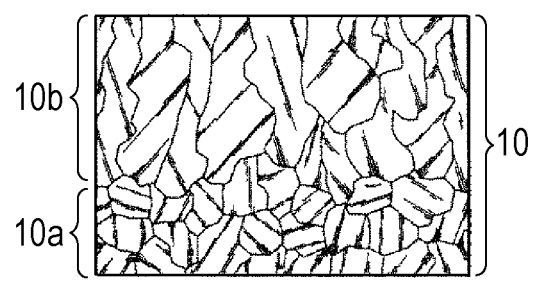
FIG. 5H is an enlarged cross-sectional view schematically showing a first plating layer and a second plating layer included in a metal member.

In the plating treatment described above, as shown in FIG. 5H, after the "first plating layer 10a formed of grains having a relatively small average crystal grain diameter" is formed, the "second plating layer 10b formed of grains having a relatively large average crystal grain diameter" may be formed so as to form the metal member 10. FIG. 5H is an enlarged cross-sectional view schematically showing the first plating layer 10a and the second plating layer 10b included in the metal member 10. For example, the metal member 10 may be formed so that the average crystal grain diameter of the first plating layer 10a is 2 µm or less, and the average crystal grain diameter of the second plating layer 10b is 5 µm or more. In more particular, for example, the "average crystal grain diameter of the first plating layer 10a" may be set to more than 0 to 2 µm, and the "average crystal grain diameter of the second plating layer 10b" may be set to 5 to 20 µm. The first plating layer 10a and the second plating layer 10b as described above can be formed by using various plating methods. For example, when a wet plating method is performed after a dry plating method is performed, the "first plating layer 10a formed of grains having a relatively small average crystal grain diameter" and the "second plating layer 10b formed of grains having a relatively large average crystal grain diameter" can be formed. In other words, an "underlying layer formed of grains having a relatively small average crystal grain diameter" is formed by a dry plating method, and subsequently, a "thick layer formed of grains having a relatively large average crystal grain diameter" may be formed by a wet plating method. By the use of the wet plating method, since the metal member 10 can be formed to have a large thickness, the metal member 10 can be used as a "heat dissipation member" and the like. By the use of the dry plating method, since the first plating layer 10a is formed, the second plating layer 10b can be formed by the wet plating method to have a large thickness and a good adhesion strength. Simply by way of example, the thickness of the first plating layer 10a, which is the dry plating layer, is 100 to 3,000 nm, and the thickness of the second plating layer 10b, which is the wet plating layer, is 18 to 500 µm.

As the dry plating method, a PVD method or a CVD method may be performed. As the PVD method, for example, sputtering, vacuum deposition, and ion plating may be mentioned. On the other hand, as the wet plating method, for example, an electric plating method (such as electrolysis plating), a chemical plating method, and a hot dipping method may be mentioned. As a certain aspect, according to the manufacturing method of the present disclosure, as the dry plating method, sputtering may be performed, and as the wet plating method, an electric plating method may be performed.

The first plating layer 10a formed by the dry plating method may contain at least one metal material selected from the group consisting of titanium (Ti), chromium (Cr), and nickel (Ni). On the other hand, the second plating layer 10b formed by the wet plating method may contain at least one metal material selected from the group consisting of copper (Cu), nickel (Ni), and aluminum (Al). Simply by way of example, the first plating layer 10a may be formed not only as a single layer but also as a multilayer. For example, as the first plating layer 10a, a Ti layer and a Cu layer may be formed by sputtering. In this case, on the sputtering layer having the two-layer structure as described above, as the second plating layer 10b, a thick Cu plating layer may be formed by an electrolysis plating method.

The step (iii) is performed following the step (ii). That is, as shown in FIG. 5D, the metal member 10 is processed by a patterning treatment, so that the die bond portion 12 and the terminal electrode portions 17 are formed. In particular, the at least one region 200 of the metal member 10 between the die bond portion 12 and terminal electrode portions 17 is at least removed. As shown in the figure, the region 200 of the metal member 10 located between the die bond portion 12 and the terminal electrode portions 17 may be removed so that at least a part of the top surface of each ceramic substrate 20 is exposed.

The patterning treatment itself is not particularly limited as long as being used in electronic mounting fields. For example, a desired patterning treatment may be performed by using a photolithography in which resist formation, exposure, development, etching, and the like are carried out.

In addition, in the step shown in FIG. 5C or the step shown in FIG. 5D, a treatment for planarizing the surface of the metal member 10 may be performed. That is, after the formation of the metal member 10 and before the patterning treatment, or after the patterning treatment and before the mounting of the electronic component, the metal member 10 may be processed by a planarization treatment. For example, the planarization treatment may be performed by polishing irregularities of the surface of the metal member 10. When the metal member 10 is planarized, the reliability of the electronic component 30 mounted on the die bond portion 12 can be further improved, and the heat dissipation property can be further improved by decreasing the number of voids present between the electronic component 30 and the die bond portion 12. In addition, after the formation of the metal member 10 or the patterning treatment, a different metal layer containing a material different from that of the metal member 10 may be formed. For example, a different metal layer may be formed on the surface of the metal member 10. As a material of the different metal layer described above, for example, a metal material may be selected in accordance with the type of wire bonding mounting or flip chip mounting, which is a subsequent step. In particular, a different metal layer may be provided so as to cover the surface of an object to be processed. Simply by way of example, when wire bonding is performed using an aluminum wire in a subsequent step, the surface of the object may be covered with nickel (Ni). As a covering method, a plating treatment may be performed. When the surface of the terminal electrode portion or the like is processed as described above, the adhesion between the wire and the terminal electrode portion 17 can be further improved.

The step (iv) is performed following the step (iii). That is, as shown in FIG. 5E, the electronic component 30 is disposed on the die bond portion 12 and is then electrically connected to the terminal electrode portions 17. In more particular, for example, the electronic component 30 is fixed on the die bond portion 12, and terminals of the electronic component 30 are electrically connected to the terminal electrode portions 17 with metal lines 70 such as wires.

The electronic component 30 fixed on the die bond portion 12 may be a power semiconductor element. For example, as the power semiconductor element, a wide gap semiconductor element may be used. In the case of the power semiconductor element as described above, an electronic component package having a low switching loss and a higher conversion efficiency can be obtained. In addition, in the figure, although a single semiconductor element is shown as the electronic component 30, a plurality of electronic components 30 may also be used.

As a method for fixing the electronic component 30 on the die bond portion 12, a common die bonding method may be used. That is, the electronic component 30 may be mounted, for example, using a solder material, an electrically conductive adhesive, a metal nano particle material, or the combination thereof.

The metal line 70 functioning as a wire and electrically connecting the electronic component 30 and the terminal electrode portion 17 is not particularly limited as long as being formed of a material generally used for wire bonding. For example, the metal line 70 may contain at least one metal material selected from the group consisting of gold, aluminum, and copper. In addition, in the figure, although the structure in which the electrical connection between the electronic component 30 and the terminal electrode portions 17 is performed by wire bonding is shown, the electrical connection is not limited thereto. For example, the package may be formed by flip chip mounting, and by this method, a smaller electronic component package can also be obtained.

The step (v) is performed following the step (iv). That is, as shown in FIG. 5F, the sealing resin layer 40 is formed on the carrier 50 so as to cover the electronic component 30, the metal member 10, and the ceramic substrates 20. In more particular, the sealing resin layer 40 is formed so as to cover the ceramic substrates 20; the die bond portion 12 and the terminal electrode portions 17, which are formed from the metal member 10 bonded to the ceramic substrates 20; and the electronic component 30 disposed on the die bond portion 12. When the sealing resin layer 40 is formed as described above, the package precursor 60 can be obtained.

The sealing resin layer 40 can be provided in such a way that after a resin raw material is applied on the adhesive layer 54 of the carrier 50 by a spin coating method, a doctor blade method, a potting method, or the like, a heat treatment, light irradiation, or the like is performed. That is, the resin raw material thus applied is heat-cured or photo-cured, so that the sealing resin layer 40 can be provided. Alternatively, by a different method, the sealing resin layer 40 may be provided by adhering a resin film to the adhesive layer 54 of the carrier 50. Furthermore, when an uncured powder or a liquid sealing resin is filled in a mold and is then heat-cured, the sealing resin layer 40 can be provided.

As a material of the sealing resin layer 40, any type of material may be used as long as having an insulating property. A material of the sealing resin layer 40 may be at least one selected from the group consisting of an acrylic resin, a urethane resin, a silicone resin, a fluorinated resin, a polyimide resin, and an epoxy resin. The thickness of he sealing resin layer 40 may be approximately 1.2 to 6.0 mm and may also be approximately 2.5 to 4.0 mm.

The step (vi) is performed following the step (v). That is, as shown in FIGS. 5F and 5G, the carrier 50 is peeled away from the package precursor 60. Accordingly, the ceramic substrates 20, the die bond portion 12, and the terminal electrode portions 17 are exposed from the surface of the sealing resin layer 40.

In the package precursor 60, since the die bond portion 12, the terminal electrode portions 17, the ceramic substrates 20, and the sealing resin layer 40 are directly bonded on the carrier 50, when the carrier 50 described above is peeled away, the die bond portion 12, the terminal electrode portions 17, the ceramic substrates 20, and the sealing resin layer 40 are flush with each other.

Depending on a mounting temperature of the electronic component 30, the carrier 50 may be peeled away after the step shown in FIG. 5C or FIG. 5D. That is, after the formation of the metal member 10 and before the patterning treatment, or after the patterning treatment and before the mounting of the electronic component, the carrier 50 may be peeled away. However, as shown in FIG. 5F and FIG. 5G, when the carrier 50 is peeled away after the formation of the sealing resin layer 40, for example, a handling property in a subsequent step is improved.

By the steps as described above, a desired electronic component package 100 can be obtained. In addition, after the steps described above are performed, for example, a dicing treatment may also be performed.

In the electronic component package 100 formed as described above, at the bottom surface thereof, the die bond portion 12 and the terminal electrode portions 17, which are formed from the metal member 10 bonded to the ceramic substrates 20 having an excellent thermal conductivity, are exposed. Hence, compared to the related package structure in which a sealing resin layer having a low thermal conductivity is exposed to the bottom surface, the variation in temperature of the entire electronic component package 100 of the present disclosure is reduced, and heat generated therein can be efficiently transmitted to the lower side. In addition, in the electronic component package 100 of the present disclosure, since the variation in temperature at the bottom surface is reduced, the transient thermal characteristics and the solder mountability in the secondary mounting are improved, and as a result, solder melting can be uniformly performed in the secondary mounting.

Furthermore, in the electronic component package 100 of the present disclosure, since the creepage insulation property required for a package using a high voltage and a large current is secured by the ceramic substrate 20 exposed to the bottom surface, the distance between the terminals in the package can be decreased. Hence, in the electronic component package 100 of the present disclosure, the reduction in size of the entire package and the reduction in inductance caused by the diameters and lengths of wires can be achieved.

Second Embodiment

Next, a manufacturing method according to a second embodiment of the present disclosure will be described with reference to FIGS. 6A to 6G.

The manufacturing method according to this embodiment comprises:
(i) a step of disposing ceramic substrates and non-plating metal portions on a carrier having an adhesive property;
(ii) a step of forming a plating layer covering the ceramic substrates and the non-plating metal portions by performing a plating treatment to obtain a metal member in which the plating layer and the non-plating metal portions are disposed in combination;
(iii) a step of forming a die bond portion and terminal electrode portions from the metal member by performing a patterning treatment thereon;
(iv) a step of disposing an electronic component on the die bond portion and electrically connecting the electronic component to the terminal electrode portions;
(v) a step of forming a sealing resin layer on the carrier so as to cover the electronic component, the metal member, and the ceramic substrates to obtain a package precursor; and
(vi) a step of peeling the carrier away from the package precursor to expose the ceramic substrates, the die bond portion, and the terminal electrode portions from the surface of the sealing resin layer. In this embodiment, the non-plating metal portion corresponds to a first metal portion of the present disclosure, and the plating layer corresponds to a second metal portion of the present disclosure.

With reference to FIGS. 6A to 6G, the manufacturing method according to the second embodiment of the present disclosure will be described in detail. In addition, in FIGS. 6A to 6G, the same constituent element as that shown in FIGS. 5A to 5H will be designated by the same reference numeral. In addition, the description duplicated with that of the first embodiment will be omitted.

Figure 6A:
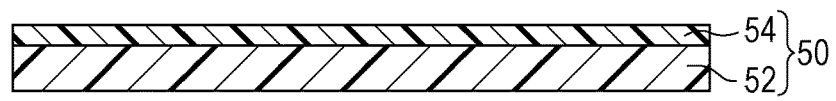
FIG. 6A is a step cross-sectional view schematically showing a method for manufacturing the electronic component package according to the second embodiment of the present disclosure.
Figure 6B:
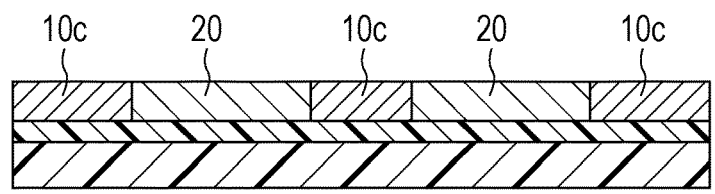
FIG. 6B is a step cross-sectional view schematically showing the method for manufacturing the electronic component package according to the second embodiment of the present disclosure.
Figure 6C:
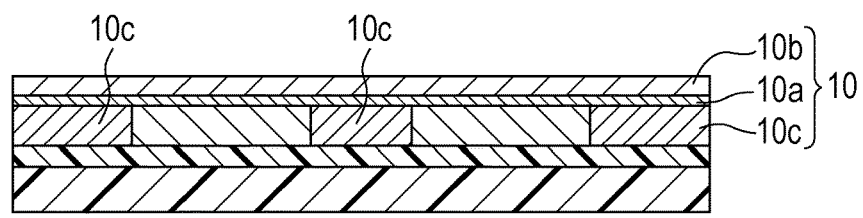
FIG. 6C is a step cross-sectional view schematically showing the method for manufacturing the electronic component package according to the second embodiment of the present disclosure.

First, as the step (i), as shown in FIGS. 6A and 6B, the ceramic substrates 20 and the non-plating metal portions 10c are disposed on the carrier 50 having an adhesive property. In more particular, the ceramic substrates 20 and the non-plating metal portions 10c are disposed so as to be adhered onto the carrier 50.

The non-plating metal portion 10c may be a lead frame processed by a patterning treatment or a separated metal material configured to be engaged with the ceramic substrate 20. As a metal material of the non-plating metal portion 10c as described above, at least one material selected from the group consisting of copper (Cu), aluminum (Al), silver (Ag), palladium (Pd), platinum (Pt), and nickel (Ni) may be used. The thickness of the non-plating metal portion 10c may be similar to that of the ceramic substrate 20, may be 0.1 to 2.0 mm, and may also be 0.2 to 1.0 mm.

In a certain aspect, as shown in the figure, the non-plating metal portions 10c may be provided so as to be flush with the ceramic substrates 20. In more particular, the non-plating metal portions 10c and the ceramic substrates 20 may be provided adjacent to each other so that the top surfaces of the non-plating metal portions 10c and the top surfaces of the ceramic substrates 20 are flush with each other.

Next, as the step (ii), by a plating treatment, the first plating layer 10a, which covers the ceramic substrates 20, and the second plating layer 10b are formed. By the step described above, the metal member 10 formed of the plating layers and the non-plating metal portions 10c in combination is obtained (see FIG. 6C). The plating treatment described above may be similar to that of the above first embodiment.

Figure 6D:
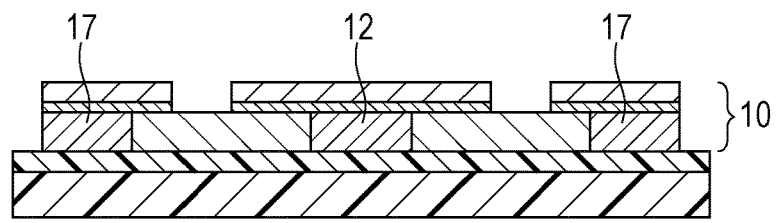
FIG. 6D is a step cross-sectional view schematically showing the method for manufacturing the electronic component package according to the second embodiment of the present disclosure.
Figure 6E:
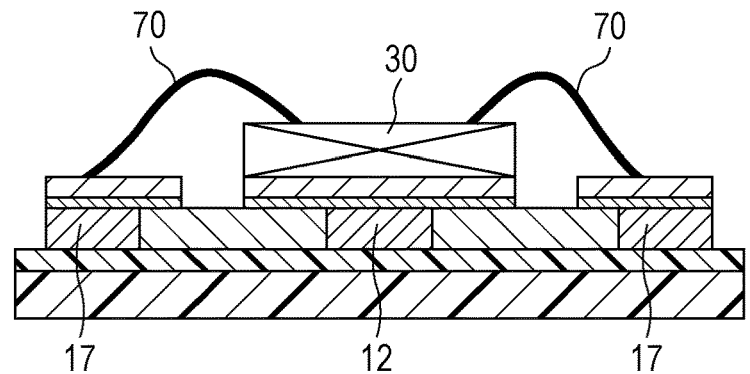
FIG. 6E is a step cross-sectional view schematically showing the method for manufacturing the electronic component package according to the second embodiment of the present disclosure.

After the metal member 10 formed of the plating layers and the non-plating metal portions in combination is obtained, as the step (iii), the metal member 10 described above is processed by a patterning treatment, so that the die bond portion 12 and the terminal electrode portions 17 are formed therefrom (see FIG. 6D). Subsequently, as the step (iv), the electronic component 30 is disposed on the die bond portion 12 and is then electrically connected to the terminal electrode portions 17. For example, as shown in FIG. 6E, the electronic component 30 is fixed on the die bond portion 12, and terminals of the electronic component 30 and the respective terminal electrode portions 17 are electrically connected to each other with the metal lines 70 such as wires. Next, as the step (v), the sealing resin layer 40 is formed on the carrier 50 so as to cover the electronic component 30, the metal member 10, and the ceramic substrates 20. In more particular, the sealing resin layer 40 is formed on the carrier 50 so as to cover the ceramic substrates 20; the die bond portion 12 and the terminal electrode portion 17, which are formed from the metal member 10 bonded to the ceramic substrates 20; and the electronic component 30 disposed on the die bond portion 12. The sealing resin layer 40 is formed as described above, so that the package precursor 60 can be obtained.

Figure 6F:
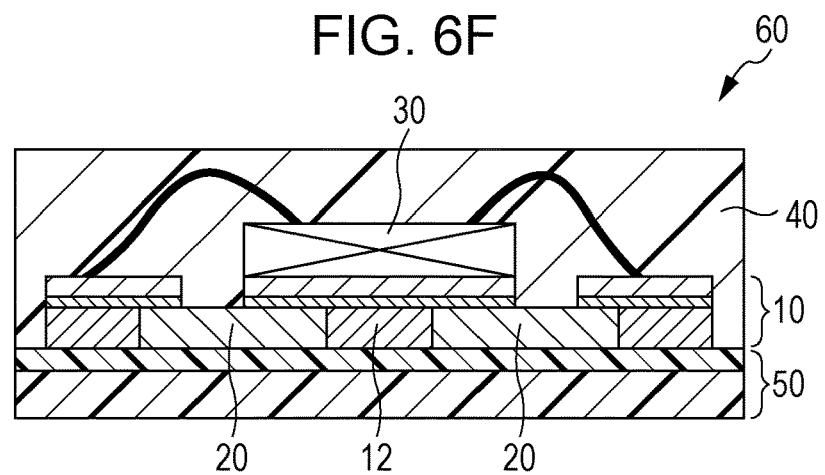
FIG. 6F is a step cross-sectional view schematically showing the method for manufacturing the electronic component package according to the second embodiment of the present disclosure.
Figure 6G:
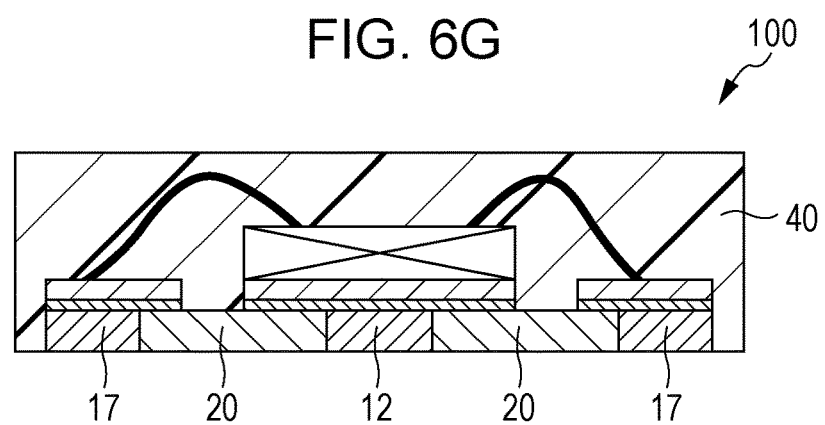
FIG. 6G is a step cross-sectional view schematically showing the method for manufacturing the electronic component package according to the second embodiment of the present disclosure.

Finally, as the step (vi), the carrier 50 is peeled away from the package precursor 60, and the ceramic substrates 20, the die bond portion 12, and the terminal electrode portions 17 are exposed from the surface of the sealing resin layer 40 (see FIGS. 6F and 6G). Accordingly, the electronic component package 100 can be obtained. Compared to the first embodiment, as the electronic component package 100, the effect similar to that described above can be obtained, and since the non-plating metal portions 10c are included in the metal member 10, the time required for the plating treatment can be shortened. In addition, depending on the material of the non-plating metal portion 10c and the surface roughness thereof, the peeling of the carrier may be simplified in some cases.

Heretofore, although the embodiments of the present disclosure have thus been described, only typical examples have been merely described. Hence, the present disclosure is not limited to those described above, and it is to be easily understood by a person skilled in the art that various aspects may be performed.

In the aspects shown in the figures, the structure in which the ceramic substrate 20 extends from the die bond portion 12 to the terminal electrode portion 17 is shown by way of example, the structure is not limited thereto. For example, in an electronic component package which is not required to have a high heat dissipation property, the structure in which the ceramic substrate is disposed only in the recess portion 120 located at the outer edge of the die bond portion 12 may also be used.

What is claimed is:

1. An electronic component package comprising:
   a sealing resin layer;
   a metal member buried in the sealing resin layer and including a die bond portion and a terminal electrode portion located outside the die bond portion;
   a ceramic substrate buried in the sealing resin layer; and
   an electronic component disposed on the die bond portion,
   wherein when viewed in plan, the die bond portion and the ceramic substrate are partially overlapped and in contact with each other,
   when viewed in plan, the terminal electrode portion and the ceramic substrate are partially overlapped and in contact with each other,
   the electronic component and the terminal electrode portion are electrically connected to each other,
   the metal member includes a first plating layer and a second plating layer disposed on the first plating layer, and
   an average crystal grain diameter of the first plating layer is smaller than an average crystal grain diameter of the second plating layer.

2. The electronic component package according to claim 1,
   wherein an outer edge of a bottom surface of the die bond portion and an outer edge of a top surface of the ceramic substrate are in contact with each other.

3. The electronic component package according to claim 1,
   wherein an outer edge of a bottom surface of the die bond portion includes a first recess portion, and
   the ceramic substrate includes a first portion which is disposed in the first recess portion.

4. The electronic component package according to claim 1,
   wherein an outer edge of a bottom surface of the terminal electrode portion and an outer edge of a top surface of the ceramic substrate are in contact with each other.

5. The electronic component package according to claim 1,
   wherein an outer edge of a bottom surface of the terminal electrode portion includes a second recess portion, and
   the ceramic substrate includes a second portion which is disposed in the second recess portion.

6. The electronic component package according to claim 1,
   wherein the die bond portion, the terminal electrode portion, and the ceramic substrate are flush with each other at a bottom surface of the electronic component package.

7. The electronic component package according to claim 1,
   wherein the first plating layer of the die bond portion and the ceramic substrate are in contact with each other, and
   the first plating layer of the terminal electrode portion and the ceramic substrate are in contact with each other.

8. The electronic component package according to claim 1,
   wherein the electronic component includes a power semiconductor element.

9. The electronic component package according to claim 8,
   wherein the power semiconductor element is a wide gap semiconductor element.

10. A method for manufacturing an electronic component package, the method comprising:
    forming a die bond portion and a terminal electrode portion by performing a patterning treatment on a metal member bonded to a ceramic substrate on a carrier;
    disposing an electronic component on the die bond portion;
    forming a package precursor including the carrier, the ceramic substrate, the metal member, and the electronic component by forming a sealing resin layer on the carrier so as to cover at least the electronic component; and
    peeling the carrier away from the package precursor.

11. The method for manufacturing an electronic component package according to claim 10,
    wherein in the forming a die bond portion and a terminal electrode portion, a region of the metal member between the die bond portion and the terminal electrode portion is at least removed.

12. The method for manufacturing an electronic component package according to claim 10,
    further comprising, before the forming a die bond portion and a terminal electrode portion, forming the metal member on the ceramic substrate by performing a plating treatment thereon.

13. The method for manufacturing an electronic component package according to claim 12,
    wherein as the plating treatment, wet plating is performed after dry plating is performed.

14. The method for manufacturing an electronic component package according to claim 10,
    further comprising, before the disposing an electronic component on the die bond portion, planarizing a surface of the die bond portion.

15. The method for manufacturing an electronic component package according to claim 10,
    further comprising, before the forming a die bond portion and a terminal electrode portion, disposing the ceramic substrate on the carrier; and
    after the disposing an electronic component on the die bond portion, electrically connecting the electronic component to the terminal electrode portion.

16. The method for manufacturing an electronic component package according to claim 10,
    further comprising, before the forming a die bond portion and a terminal electrode portion, disposing on the carrier, the ceramic substrate and a first metal portion obtained by a method other than a plating treatment; and
    forming a second metal portion covering the ceramic substrate and the first metal portion by performing a plating treatment,
    wherein the metal member includes the first metal portion and the second metal portion.

17. The method for manufacturing an electronic component package according to claim 10, wherein the sealing resin layer covers the terminal electrode portion.

* * * * *